(12) United States Patent
Yoon et al.

(10) Patent No.: US 8,451,645 B2
(45) Date of Patent: May 28, 2013

(54) VARIABLE RESISTANCE MEMORY DEVICES AND METHODS OF PROGRAMMING VARIABLE RESISTANCE MEMORY DEVICES

(75) Inventors: Hong-Sik Yoon, Seongnam-si (KR); Min-Young Park, Suwon-si (KR); In-Gyu Baek, Seoul (KR); Hyun-Jun Sim, Hwaseong-si (KR); Jin-Shi Zhao, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 264 days.

(21) Appl. No.: 12/851,681

(22) Filed: Aug. 6, 2010

(65) Prior Publication Data
US 2011/0032747 A1 Feb. 10, 2011

(30) Foreign Application Priority Data
Aug. 7, 2009 (KR) .................. 10-2009-0072889

(51) Int. Cl.
*G11C 11/00* (2006.01)
(52) U.S. Cl.
USPC .............. 365/148; 365/163; 365/189.09
(58) Field of Classification Search
USPC ................ 365/148, 189.09, 189, 163
See application file for complete search history.

(56) References Cited

U.S. PATENT DOCUMENTS

| 6,487,113 | B1 * | 11/2002 | Park et al. ............... 365/163 |
|---|---|---|---|
| 7,423,906 | B2 | 9/2008 | Symanczyk |
| 7,471,543 | B2 | 12/2008 | Nakashima et al. |
| 2005/0128799 | A1 | 6/2005 | Kurotsuchi et al. |
| 2006/0274593 | A1 | 12/2006 | Kurotsuchi et al. |
| 2007/0217252 | A1 | 9/2007 | Symanczyk |
| 2009/0003037 | A1 | 1/2009 | Symanczyk |
| 2010/0038619 | A1 * | 2/2010 | Tada et al. ................ 257/3 |
| 2011/0051492 | A1 * | 3/2011 | Toda ..................... 365/148 |
| 2011/0194328 | A1 * | 8/2011 | Kim et al. ............... 365/148 |

FOREIGN PATENT DOCUMENTS

| KR | 20050054851 A | 6/2005 |
|---|---|---|
| KR | 20070093888 A | 9/2007 |
| KR | 20080009315 A | 1/2008 |
| WO | WO2006137111 | 12/2006 |

\* cited by examiner

*Primary Examiner* — Richard Elms
*Assistant Examiner* — Hai Pham
(74) *Attorney, Agent, or Firm* — Volentine & Whitt, PLLC

(57) ABSTRACT

A variable resistance memory device includes a variable resistance memory cell, and a by-pass circuit configured to electrically by-pass a programming pulse supplied to the variable resistance memory cell after a resistive state of the variable resistance memory cell has changed in response to the programming pulse.

15 Claims, 11 Drawing Sheets

VARIABLE RESISTANCE MEMORY DEVICES AND METHODS OF PROGRAMMING VARIABLE RESISTANCE MEMORY DEVICES

CROSS-REFERENCE TO RELATED APPLICATION

A claim of priority is made to Korean patent application no. 10-2009-0072889, filed Aug. 7, 2010, the disclosure of which is incorporated herein in its entirety.

BACKGROUND

The inventive concepts described herein generally relate to memory devices, and more particularly, the inventive concepts relate to variable resistance memory devices and to methods of programming variable resistance memory devices.

Non-volatile memory devices are widely used in many consumer, commercial and other applications. While some non-volatile memory devices, such as flash memory, use accumulated charge to store data, some other memory devices, such as resistive random access memory (ReRAM), phase change RAM (PRAM), and magnetic RAM (MRAM), use changes in resistivity of a material therein as the mechanism by which data is stored.

A resistive random access memory (ReRAM) is a non-volatile memory device that uses changing resistance characteristics of a material having a variable resistance that changes significantly at a particular voltage. In one example, the material may be a transition metal oxide (TMO). When a "SET" voltage is applied to a variable resistance material, a resistance of the variable resistance material decreases. This state is typically referred to as a SET state or an ON state. When a "RESET" voltage is applied to a variable resistance material, the resistance of the variable resistance material increases. This state is typically referred to as a RESET state or an OFF state.

FIGS. 1A and 1B illustrate exemplary ReRAM memory cells. In the example of FIG. 1A, the ReRAM memory cell includes a diode DP and variable resistance element RP connected in series between a bit line BL and a word line WL. In the example of FIG. 1B, the ReRAM memory cell includes a transistor N1 and a variable resistive element RP connected in series between a bit line BL and a reference potential (VSS), with a gate of the transistor N1 connected to a word line WL. In these examples, the diode DP and transistor N1 function as switching elements responsive to voltages applied to the bit line BL and/or word line BL.

SUMMARY

According to an aspect of the inventive concepts described herein, a variable resistance memory device is provided which includes a variable resistance memory cell, and a by-pass circuit configured to electrically by-pass a programming pulse supplied to the variable resistance memory cell after a resistive state of the variable resistance memory cell has changed in response to the programming pulse.

According to another aspect of the inventive concepts described herein, a variable resistance memory device is provided which includes a variable resistance memory cell array including a plurality of variable resistance memory cells electrically connected between a plurality of bit lines and a plurality of words lines, a current limiting circuit which limits a cell current magnitude of the variable resistance memory cells, and a by-pass circuit configured to electrically by-pass a programming pulse supplied to the variable resistance memory cells after a resistive state of the variable resistance memory cells has changed in response to the programming pulse.

According to yet another aspect of the inventive concepts described herein, a computing system is provided which includes a bus system, a central processing unit (CPU) operative coupled to the bus system, and a non-volatile random access memory. The non-volatile random access memory includes non-volatile variable resistance memory cells, and a by-pass circuit configured to electrically by-pass a programming pulse supplied to the variable resistance memory cells after a resistive state of the variable resistance memory cells has changed in response to the programming pulse.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION OF EMBODIMENTS

Figure 1A:
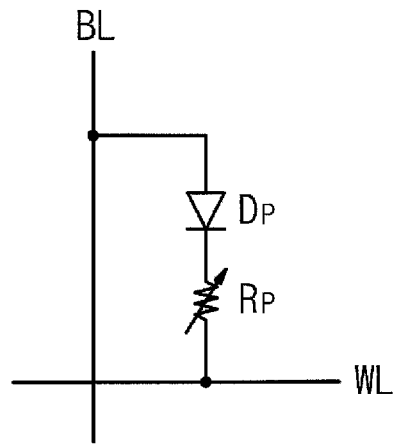
FIGS. 1A and 1B illustrate an example of an equivalent circuit diagram of a variable resistance memory cell.
Figure 1B:
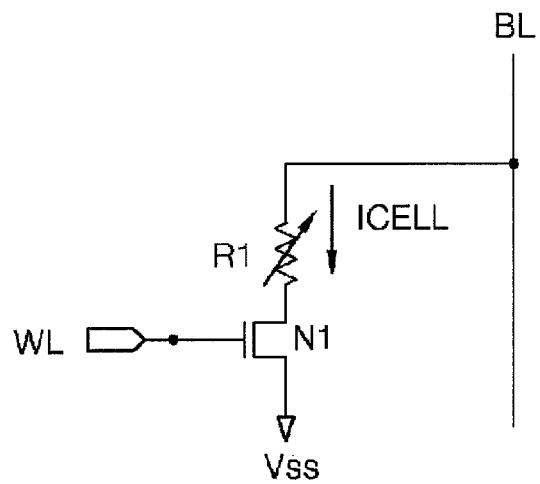

Various example embodiments are described with reference to the accompanying drawings, where like reference numbers are used to denote like or similar elements. The inventive concepts may, however, be embodied in many different forms and should not be construed as limited to the embodiments set forth herein.

In the drawings, the relative dimensions of device layers may be exaggerated for clarity. That is, for example, the relative thicknesses and/or widths of layers may be varied from those depicted. For example, unless the description clearly indicates otherwise, if a first layer is shown as being thicker than a second layer, the two layers may instead have the same thickness or the second layer may be thicker than the first layer.

To facilitate understanding, a number of non-limiting descriptive terms may be utilized which are not intended to define the scope of the inventive concepts. For example, although the terms "first", "second", etc. may be used herein to describe various elements, these elements should not be limited by these terms. These terms are simply used to distinguish one element from another. For example, a first element could be termed a second element, and, similarly, a second element could be termed a first element, without departing from or limiting the scope of the inventive concepts. Likewise, the words "over", "under", "above", "below", etc. are relative terms which are not intended to limit the inventive concepts to a particular device orientation. As used herein, the term "and/or" includes any and all combinations of one or more of the associated listed items.

Further, the terminology utilized herein often makes reference to a "layer" of material. It will be understood that the inventive concepts are not limited to single-layer structures when reference is made to a layer of material. For example, an insulating layer can actually encompass multiple layers of insulating material which essentially achieve the same insulating functions as a single insulating layer of material. This same reasoning is to be applied to semiconductor and conductive regions as well.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
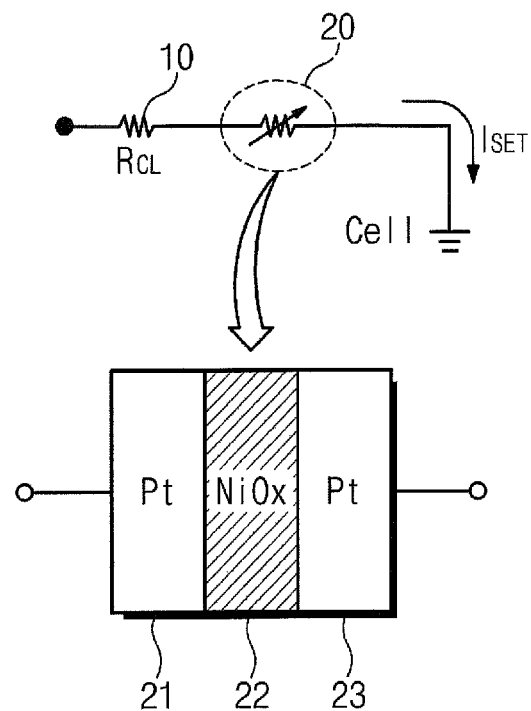
FIG. 2A contains a circuit diagram and schematic view for use in describing programming of a variable resistance memory cell.

Turning now to the drawings, FIG. 2A depicts a circuit diagram and schematic view of a variable resistance memory cell. More precisely, this figure illustrates a variable resistance memory cell 20 which, in this example, includes a resistive storage element 22 sandwiched between electrodes 21 and 23. In this particular example, the resistive storage element 22 includes a transition metal oxide (TMO) such as nickel oxide $NiO_x$ and the electrodes 21 and 23 include a metal such as platinum (Pt). Other non-limiting candidate materials for the resistive storage element 22 include a Ni oxide doped with Ti, a Co oxide, a Hf oxide, a Zn oxide, a W oxide, a Nb oxide, an Al oxide, a V oxide, a Cr oxide, a Fe oxide, a Ta oxide, a combination thereof or the like. Other non-limiting candidate materials for the electrodes 21 and 23 include Al, Hf, Zr, Zn, W, Co, Au, Ag, Pd, Ru, Ir, Ti or a conductive metal oxide, or a combination thereof or the like.

FIG. 2A also illustrates the memory cell 20 connected in series with a compliance resistance $R_{CL}$. As will be described next in connection with FIG. 2B, the compliance resistance RCL functions as a SET current (ISET) limiting device and is present in the current ($I_{SET}$) path of the memory cell 20 during SET programming of the memory cell 20.

Figure 2B:
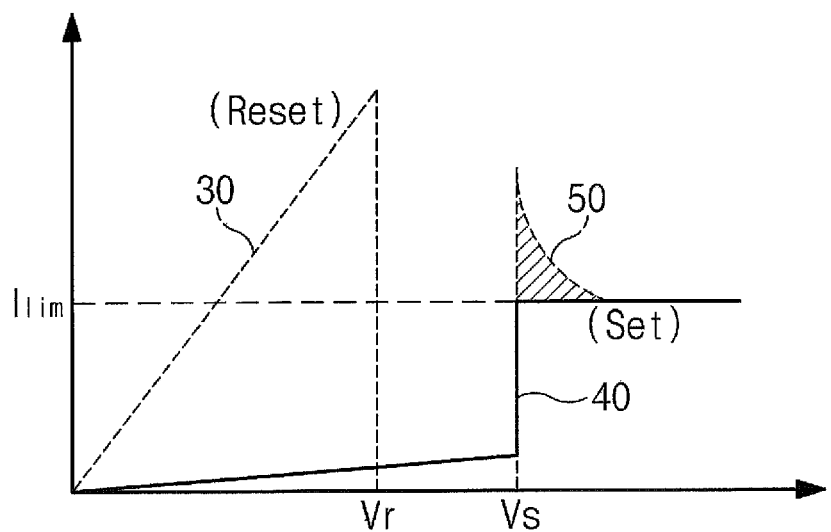
FIG. 2B is a graph illustrating voltage-current characteristics during programming of a variable resistance memory cell

FIG. 2B illustrates examples of current-voltage (I-V) characteristics during RESET and SET programming of the memory cell 20 shown in FIG. 2A.

In FIG. 2B, when the variable resistor 20 is in a SET state (low-resistance state) and a voltage applied to the variable resistor 20 increases, the resultant current increases as indicated by the dashed line 30. When the applied voltage reaches a RESET threshold voltage Vr, the resistance increases abruptly as shown, and the variable resistor 20 transitions into the RESET state (high-resistance state).

On the other hand, when the variable resistor 20 is in the RESET state and a voltage applied to the variable resistor 20 increases, the resultant current gradually increases as indicated by arrow 1. When the applied voltage reaches a SET threshold voltage Vs, the resistance of the variable resistor 20 decreases abruptly as shown, and the variable resistor 20 transitions to the SET state.

As mentioned above, the compliance resistance RCL 10 functions as a current limiting device and is present in the current ($I_{SET}$) path of the memory cell 20 during the low-resistance SET programming of the variable resistor 20. In this manner, magnitude of the SET current is limited (Ilim) during SET programming, thus avoiding unnecessary stress on the variable resistor 20. In this manner, the useful life of the variable resistor 20 may be extended.

However, due to various parasitic capacitances and the like that are present in the operational circuits of the ReRAM memory cell including the variable resistor 20, a non-ideal current limiting condition is created in which the SET current initially overshoots the limit current Ilim, and gradually drops (decays) to the limit current Ilim. This overshoot interval, which is represented in FIG. 2B by reference numeral 50, can add stress to the variable resistor 20, thus reducing the useful life the variable resistor 20.

Figure 3:
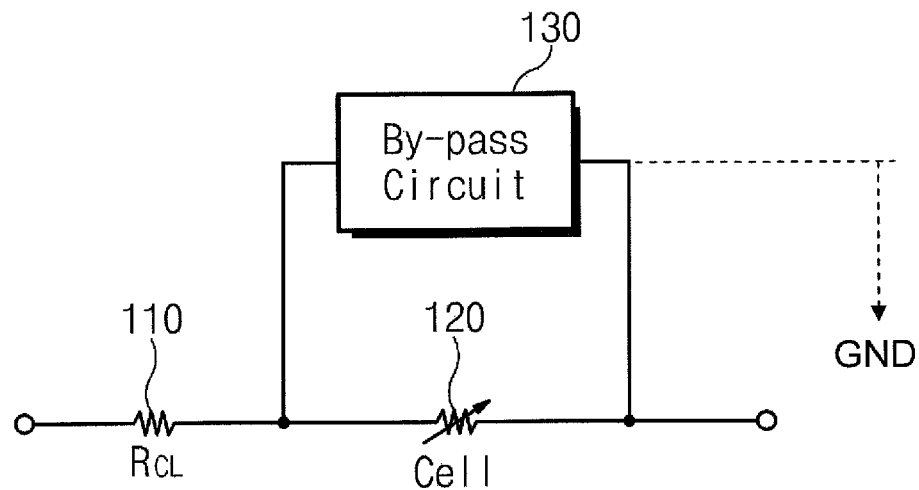
FIG. 3 is a circuit diagram illustrating a variable resistance memory device according to one or more inventive concepts described herein.

Reference is now made to FIG. 3 which illustrates a variable resistive memory device according to one or more inventive aspects described herein.

As shown in FIG. 3, the variable resistance memory cell device of this example includes variable resistance memory cell 120 and a by-pass circuit 130. Also shown is a compliance resistor RCL which may be present in the current path of the memory cell 120 when the memory cell is programmed to a given resistive state, for example, to a high resistance or SET state.

The by-pass circuit 130 is configured to electrically by-pass the memory cell 120 after the variable resistance memory cell 120 has changed its resistive state during a programming operation. FIG. 3 illustrates the by-pass circuit 130 connected in parallel with variable resistance memory cell 120. However, it will be understood that the by-pass circuit 130 may be connected in other ways to divert current supply to the variable resistance memory cell 120. For example, as shown by the dashed-line in FIG. 3, the by-passing function may be realized by diverting to ground (GND) current otherwise supplied to the variable resistance memory cell 120.

An operation of the variable resistance memory cell device shown in FIG. 3 will now be described with reference to the timing diagram of FIG. 4.

Figure 4:
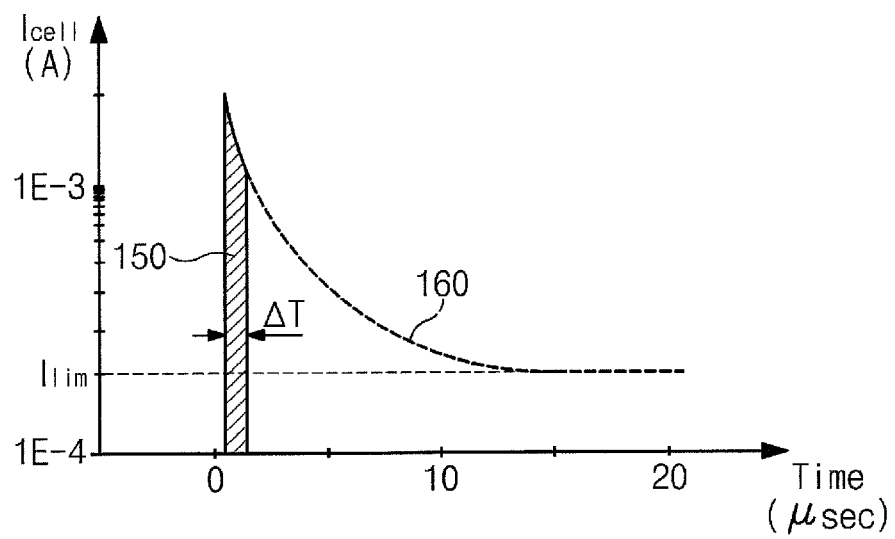
FIG. 4 is a graph illustrating an example of current characteristics of the variable resistance memory device shown in FIG. 3.

FIG. 4 illustrates an example of characteristics of a cell current Icell of the variable resistance memory cell 120 during SET programming of the memory cell 120.

Referring to FIGS. 3 and 4, during SET programming, the resistance of the memory cell 120 abruptly decreases upon application of a SET threshold voltage memory cell 120. This is described above in connection with FIG. 2B. As a result, the cell current Icell abruptly increases, and due to parasitic capacitances and the like, the cell current Icell increases beyond the SET limit current Ilim. At this time, the memory cell 120 is in the SET state. After the lapse of a given time interval ΔT, the by-pass circuit 130 operates to bypass (or divert) the current flow through the memory cell 120, thus causing the cell current Icell to abruptly drop to substantially zero. This is represented in FIG. 4 by the area designated by reference number 150. In contrast, the dashed line of reference numeral 160 denotes a cell current Icell characteristic in the absence of the by-pass circuit 130. It can be readily seen that the cumulative energy applied to the memory cell 120 by operation of the by-pass circuit 130, and thus the stress applied to the memory cell 120 is reduced.

Figure 5:
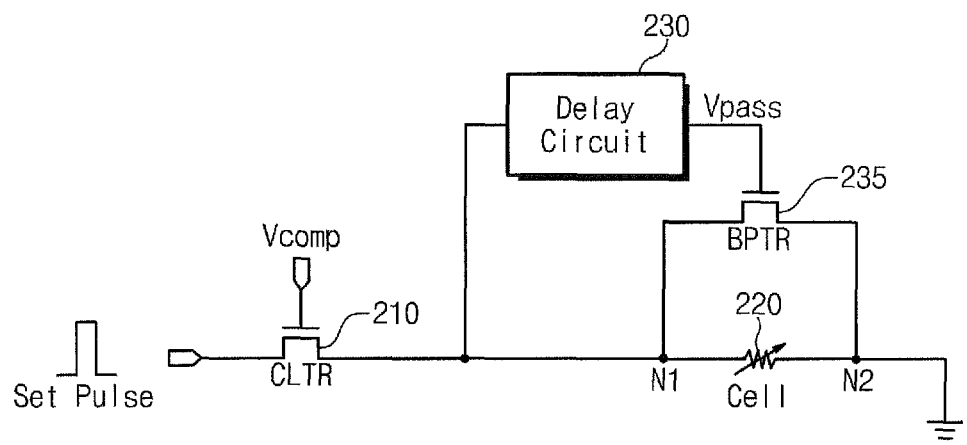
FIG. 5 is a circuit diagram illustrating a variable resistance memory device according to one or more inventive concepts described herein.

FIG. 5 illustrates a variable resistance memory cell device according to an embodiment of one or more inventive aspects described herein.

The variable resistance memory cell device of the example of FIG. 5 includes a variable resistance memory cell 220, a delay circuit 230, and a by-pass transistor 235. The by-pass transistor 235 is connected across the memory cell 220 at nodes N1 and N2, and is on/off controlled in to a by-pass signal Vpass generated by the delay circuit 230. Also shown is a compliance transistor CLTR 210 which is on/off controlled by a compliance signal Vcomp.

An example of the operation of the variable resistance memory cell device of FIG. 5 will now be described with reference to the timing diagram of FIG. 6.

Figure 6:
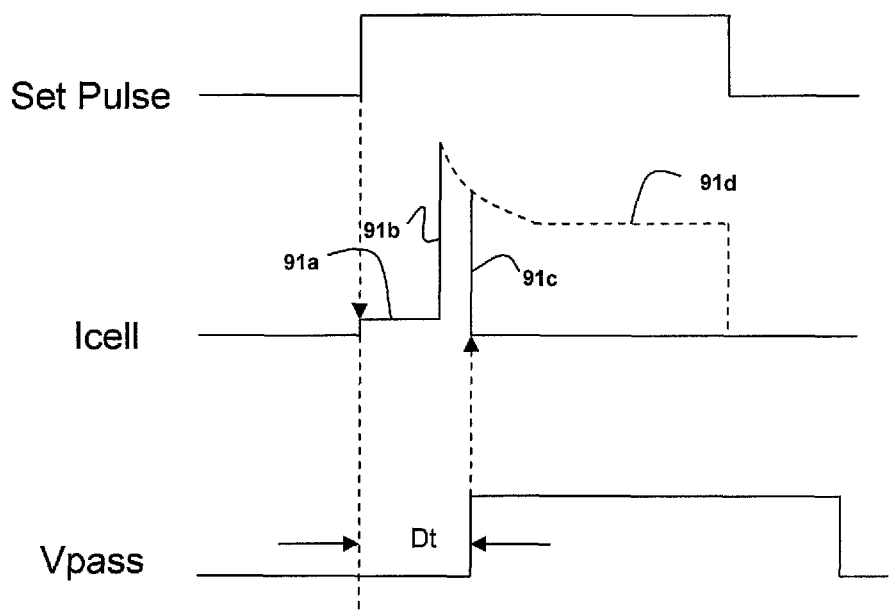
FIG. 6 is a pulse diagram illustrating an operational example of the variable resistance memory device shown in FIG. 5.

FIG. 6 is a timing diagram an example of the operation of the variable resistance memory cell device of FIG. 5. In SET programming of the memory cell 220, the compliance transistor CLTR is turned ON in response the compliance signal Vcomp, and a Set Pulse is applied to the memory cell 220 via the compliance transistor CLTR. At this time, the memory cell 220 is in the high resistance RESET state, and thus a relatively small cell current Icell initially flows through the memory cell 220 as represented by reference number 91a of FIG. 6. Then, as described above in connection with FIG. 2B, the memory cell 220 transitions to the SET state, i.e., the resistance of the memory cell 220 abruptly decreases and the cell current Icell abruptly increases (see 91b of FIG. 6). After an initial overshot in the cell current Icell beyond a limit current (Ilim in FIG. 2B), the magnitude of the cell current Icell begin to decay as a result of discharge of parasitic capacitances and the like. In the meantime, the delay circuit 230 delays the Set Pulse by a delay time Dt and generates a corresponding delayed signal pulse Vpass. The delay time Dt is set (e.g., through experimentation and/or observation) to exceed the time needed for the memory cell 220 to transition to the SET state in response to the Set Pulse, but to be less than (preferably substantially less than) the duration of the Set Pulse. After the memory cell 220 has transition to the SET state, the signal pulse Vpass is generated by the delay circuit 230 and applied to the gate of the by-pass transistor BPTR. As a result, the cell current Icell abruptly drops (at 91c of FIG. 6) as a by-pass path is established through the by-pass transistor BPTR. Preferably, the ON resistance of the by-pass transistor BPTR is substantially (10 times or more) the SET resistance of the memory cell 220.

The dashed line 91d of FIG. 6 represents the cell current Icell in the absence of operation of the delay circuit 230 and by-pass transistor 235. It is readily apparent that the energy applied to the memory cell 220 is significantly reduced by diverting current away from the memory cell 220 after transition to the SET state.

Figure 7:
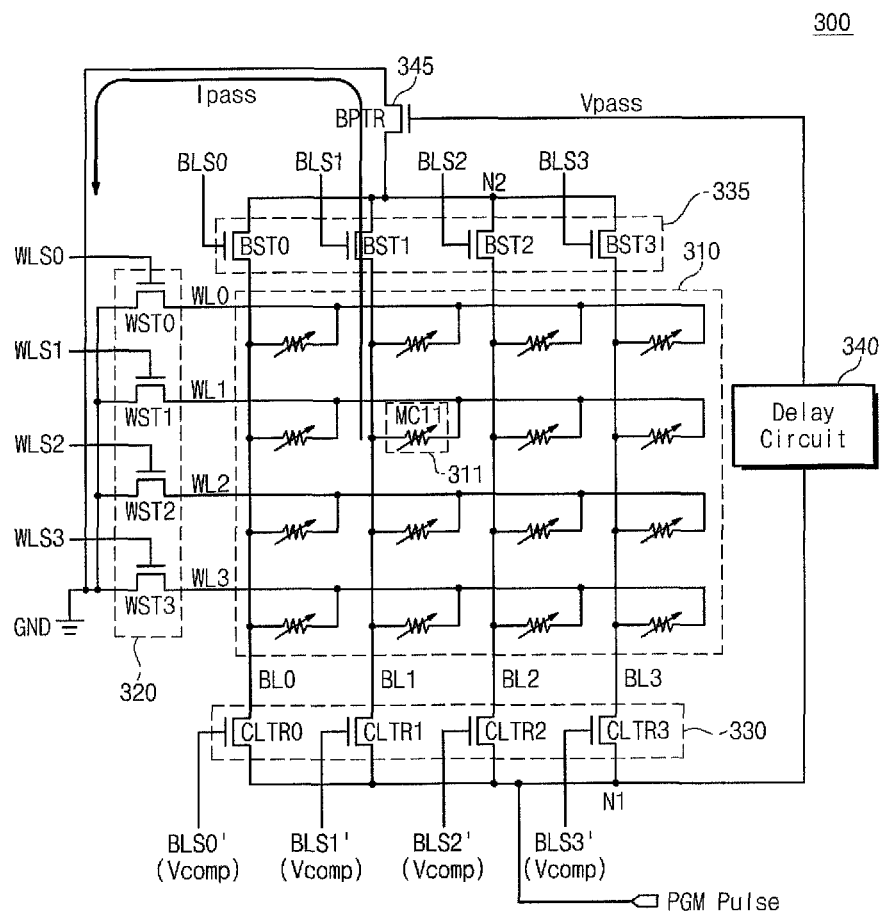
FIG. 7 is a circuit diagram illustrating a variable resistance memory device according to one or more inventive aspects described herein.

FIG. 7 is a circuit diagram illustrating a variable resistance memory cell device according to an embodiment of one or more inventive concepts described herein.

As shown in FIG. 7, the variable resistance memory cell device 300 of this example includes a memory cell array 310 including a plurality of memory cells each including variable resistance memory cell element MC. Although not shown, each memory cell may further include a switching element, such as a diode or transistor. The memory cell device 300 further includes a plurality of bit lines BL0~BL3 and word lines WL0~WL3, and the memory cells are connected at intersections thereof.

Reference number 335 of FIG. 7 denotes a column decoder, and reference numeral 320 denotes a row decoder. The column decoder 335 includes a plurality of bit line selection transistors BST0~BST3 connected between a node N2 and the respective bit lines BL0~BL3. The row decoder 320 includes a plurality of word line selection transistors WST0~WST3 connected between a reference voltage (e.g., ground GND) and the respective word lines WL0~WL3. The bit line selection transistors BST0~BST3 are respectively controlled by (gated to) first bit line selection signals BLS0~BLS3, and the word line selection transistors WST0~WST1 are respectively controlled by (gate to) word line selection signals WLS0~WLS3. The first bit line selection signals BLS0~BLS3 may, for example, correspond to column addresses, and the word line selection signals WLS0~WLS3 may, for example, correspond to row addresses.

The variable resistance memory cell device of FIG. 7 further includes a compliance circuit 330, a delay circuit 340, and a by-pass transistor 345 (BPTR).

The compliance circuit 330 includes a plurality of compliance transistors CLTR0~CLTR3 connected between a node N1 and the respective bit lines BL0~BL3. The compliance circuit 330 functions analogously to the column decoder 335 in that the compliance transistors CLTR0~CLTR3 are controlled by second bit line selection signals BLS0'~BLS3' which correspond to the first bit line selection signals BLS0~BLS3. However, each compliance transistor CLTR0~CLTR3 and/or second bit line selections signal BLS0'~BLS3' is configured to establish a given current limiting resistive element for the variable resistive memory cells connected to each bit line BL0~BL3. The first bit line selection signal BLS0~BLS3 may be the same the second bit line selection signal BLS0'~BLS3', or the first bit line selection signal BLS0~BLS3 may be separately generated from the second bit line selection signal BLS0'~BLS3'.

The delay circuit 340 and by-pass transistor 345 of FIG. 7 generally correspond to the delay circuit 230 and by-pass transistor 235 shown in previously described FIG. 5. The delay circuit 340 may, for example, include series connected invertors (not shown). However, the internal configuration of the delay circuit 340 is not limited. The by-pass transistor 345 is controlled by (gate to) an output of the delay circuit 340, and is connected between the node N2 and a reference potential (e.g., ground GND).

An operation of the variable resistance memory cell device of FIG. 7 will now be described with respect to SET programming of the memory cell 311 of the memory cell array 310.

Initially, word line WL1 and bit line BL1 are selected by the row decoder 320 and column decoder 335, i.e., by turning ON the selection transistors WST1 and BST1 in response to the word and bit line selection signals WLS1 and BLS1. In addition, the compliance transistor CLTR1 is turned ON within the compliance circuit 330 in response to the second bit line selection signal BLS1'. Then, a SET programming pulse (PGM Pulse) is applied to node N1. As a result, the resistance of the variable resistive element MC11 of the memory cell 311 abruptly decreases as described previously in connection with FIGS. 2B and 6, and the memory cell 311 is transitioned to the SET state. In the meantime, the delay circuit 340 delays the SET programming pulse (PGM Pulse) to generate a delayed pulse Vpass (see FIG. 6, described above). After the memory cell 311 has changed to the SET state, the delayed pulse Vpass turns ON the by-pass transistor 345. As a result, the programming current on the bit line BL1 resulting from the programming pulse (PGM Pulse) is diverted to ground, thus bypassing the memory cell (MC) 311.

Figure 8:
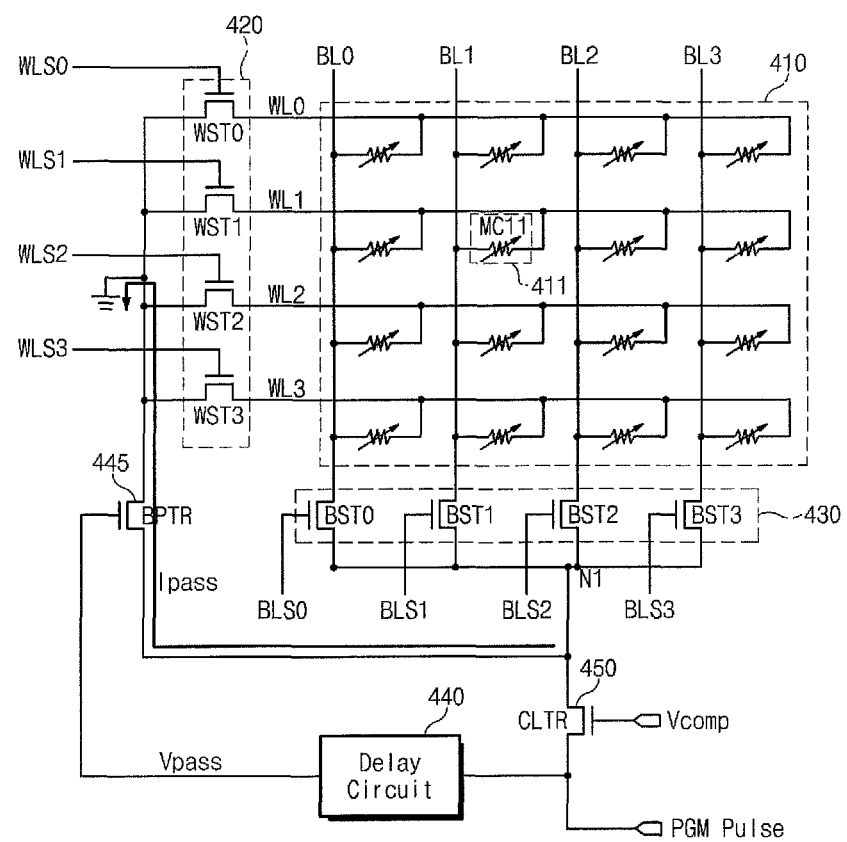
FIG. 8 is a circuit diagram illustrating a variable resistance memory device according to one or more inventive concepts described herein.

FIG. 8 is a circuit diagram illustrating a variable resistance memory cell device according to an embodiment of one or more inventive concepts described herein.

As shown in FIG. 8, the variable resistance memory cell device 400 of this example includes a memory cell array 410 including a plurality of memory cells each including variable resistance memory cell element MC. Although not shown, each memory cell may further include a switching element, such as a diode or transistor. The memory cell device 400 further includes a plurality of bit lines BL0~BL3 and word lines WL0~WL3, and the memory cells are connected at intersections thereof.

Reference number 420 of FIG. 8 denotes a row decoder, and reference numeral 430 denotes a column decoder. The column decoder 430 includes a plurality of bit line selection transistors BST0~BST3 connected between a node N1 and the respective bit lines BL0~BL3. The row decoder 420 includes a plurality of word line selection transistors WST0~WST3 connected between a reference voltage (e.g., ground GND) and the respective word lines WL0~WL3. The bit line selection transistors BST0 ~BST3 are respectively controlled by (gated to) bit line selection signals BLS0~BLS3, and the word line selection transistors WST0~WST1 are respectively controlled by (gate to) word line selection signals WLS0~WLS3. The bit line selection signals BLS0~BLS3 may, for example, correspond to column addresses, and the word line selection signals WLS0~WLS3 may, for example, correspond to row addresses.

The variable resistance memory cell device 400 of FIG. 8 further includes a compliance transistor 450 (CLTR), a delay circuit 440, and a by-pass transistor 445 (BPTR).

The compliance transistor 450 is connected between node N1 and a terminal receiving a program pulse PGM Pulse. The by-pass transistor 445 is connected between the reference voltage (e.g., ground GND) and node N1, and the delay circuit 440 has an input receiving the program pulse PGM pulse, and an output gated to the by-pass transistor 445.

An operation of the variable resistance memory cell device of FIG. 8 will now be described with respect to SET programming of the memory cell 411 of the memory cell array 410.

Initially, word line WL1 and bit line BL1 are selected by the row decoder 420 and column decoder 430, i.e., by turning ON the selection transistors WST1 and BST1 in response to the word and bit line selection signals WLS1 and BLS1. In addition, the compliance transistor 450 is turned ON in response to a compliance signal Vcomp. Then, a SET programming pulse (PGM Pulse) is applied to the compliance transistor 450 and the input of the delay circuit 440. As a result, the resistance of the variable resistive element MC11 of the memory cell 411 abruptly decreases as described previously in connection with FIGS. 2B and 6, and the memory cell 411 is transitioned to the SET state. In the meantime, the delay circuit 440 delays the SET programming pulse (PGM Pulse) to generate a delayed pulse Vpass (see FIG. 6, described above). After the memory cell 411 has changed to the SET state, the delayed pulse Vpass turns ON the by-pass transistor 445. As a result, the programming current on the bit line BL1 resulting from the programming pulse (PGM Pulse) is diverted to ground, thus electrically bypassing the memory cell (MC) 411.

Figure 9:
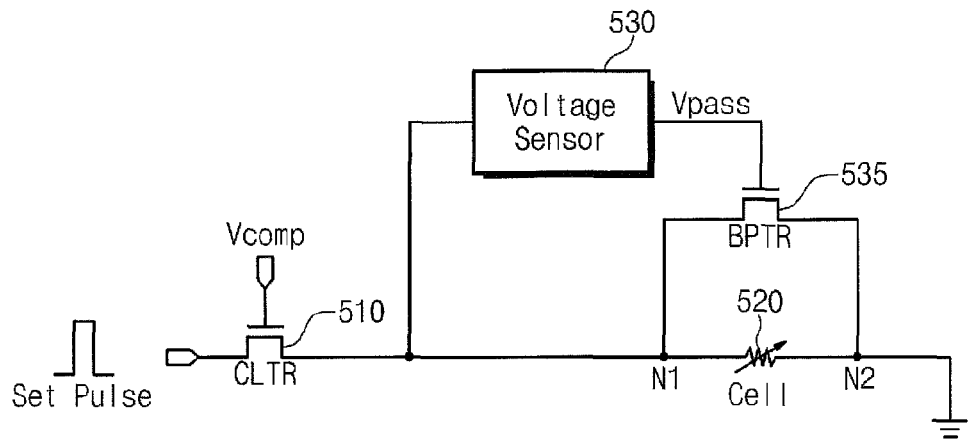
FIG. 9 is a circuit diagram illustrating a variable resistance memory device according to one or more inventive concepts described herein.

FIG. 9 illustrates a variable resistance memory cell device according to an embodiment of one or more inventive aspects described herein.

The variable resistance memory cell device of the example of FIG. 9 includes a variable resistance memory cell 520, a voltage sensor 530, and a by-pass transistor 535 (BPTR). The by-pass transistor 535 is connected across the memory cell 520 at nodes N1 and N2, and is on/off controlled in response to a by-pass signal Vpass generated by the voltage sensor 530. Also shown is a compliance transistor CLTR 510 which is on/off controlled by a compliance signal Vcomp. As explained below, the voltage sensor 530 is configured to sense a voltage drop a node N1 (i.e., across the memory cell 520), and to respond to the voltage drop by turning ON the by-pass transistor 535.

In a SET programming operation, the compliance transistor CLTR is turned ON in response the compliance signal Vcomp, and a Set Pulse is applied to the memory cell 520 via the compliance transistor CLTR. At this time, the memory cell 520 is in the high resistance RESET state. Thus, a relatively small cell current Icell initially flows through the memory cell 220 and a relative high voltage is present a node N1. Then, as described above in connection with FIG. 2B, the memory cell 520 transitions to the SET state, i.e., the resistance of the memory cell 520 abruptly decreases and the cell current Icell abruptly increases. As a result, the voltage at node N1 drops. The voltage sensor 530 senses the voltage drop at node N1, and in response, generates a signal Vpass capable of turning ON the by-pass transistor 535. As a result, the cell current Icell abruptly drops as a by-pass path is established through the by-pass transistor 535. Preferably, the ON resistance of the by-pass transistor 535 is substantially (10 times or more) the SET resistance of the memory cell 520.

Figure 10:
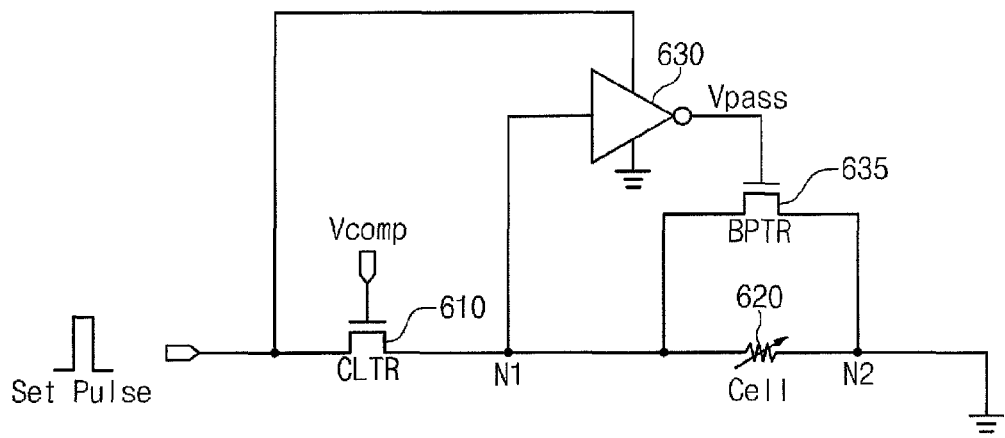
FIG. 10 is a circuit diagram illustrating a variable resistance memory device according to one or more inventive concepts described herein.

FIG. 10 illustrates a variable resistance memory cell device according to an embodiment of one or more inventive aspects described herein.

The variable resistance memory cell device of the example of FIG. 10 includes a variable resistance memory cell 620, an inverter 630, and a by-pass transistor 635 (BPTR). The by-pass transistor 635 is connected across the memory cell 620 at nodes N1 and N2, and is on/off controlled in response to a by-pass signal Vpass generated by the inverter 530. Also shown is a compliance transistor CLTR 610 which is on/off controlled by a compliance signal Vcomp. As explained below, the inverter 630 is configured to sense a voltage drop a node N1 (i.e., across the memory cell 620), and to respond to the voltage drop by turning ON the by-pass transistor 635. In this particular example, the inverter 630 outputs a LOW logic signal when the voltage at node N1 is above a threshold (i.e., relatively HIGH), and a HIGH logic signal when the voltage at node N1 is below a threshold (i.e., relative LOW). In addition, in this example, a power terminal of the inverter 630 is connected to receive a programming SET pulse signal Set Pulse.

In a SET programming operation, the compliance transistor CLTR is turned ON in response the compliance signal Vcomp, and a Set Pulse is applied to the memory cell 620 via the compliance transistor CLTR. At this time, the memory cell 620 is in the high resistance RESET state. Thus, a relatively small cell current Icell initially flows through the memory cell 620 and a relative high voltage is present a node N1. Thus, the inverter 630, which has been activated by the Set Pulse, outputs a logic LOW signal and the by-pass transistor 620 is OFF.

Then, as described above in connection with FIG. 2B, the memory cell 620 transitions to the SET state, i.e., the resistance of the memory cell 620 abruptly decreases and the cell current Icell abruptly increases. As a result, the voltage at node N1 drops to a LOW level, the Vpass output of the inverter goes to HIGH, and the by-pass transistor 635 is turned ON. The cell current Icell abruptly drops as a by-pass path is established through the by-pass transistor 635. Preferably, the ON resistance of the by-pass transistor 635 is substantially (10 times or more) the SET resistance of the memory cell 620.

Figure 11:
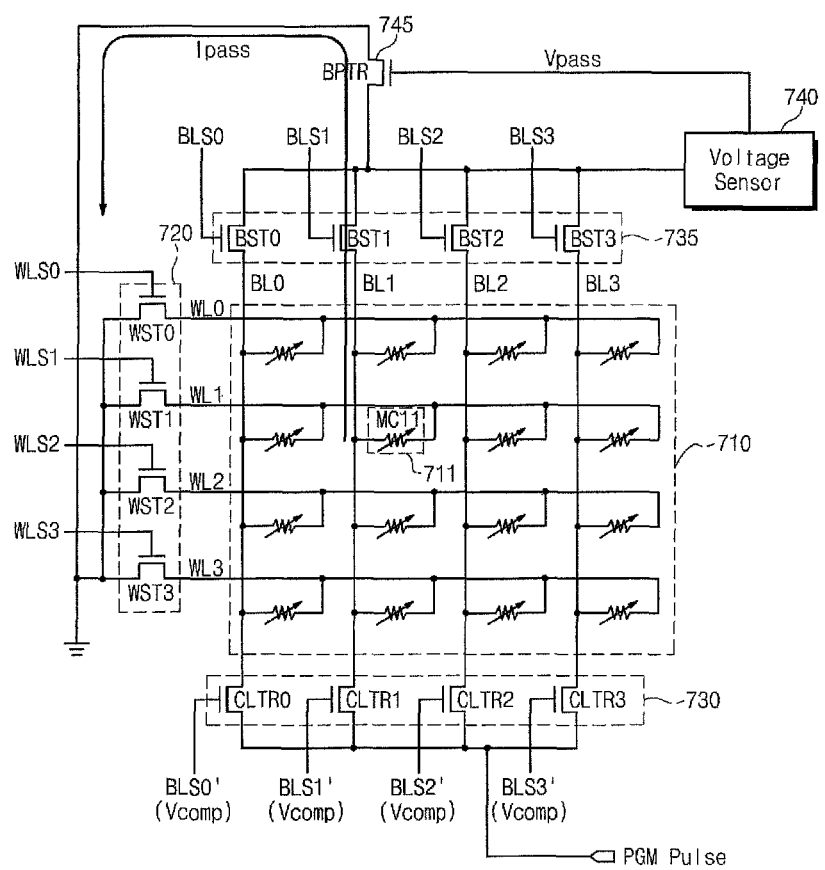
FIG. 11 is a circuit diagram illustrating a variable resistance memory device according to one or more inventive concepts described herein.

FIG. 11 is a circuit diagram illustrating a variable resistance memory cell device according to an embodiment of one or more inventive concepts described herein.

As shown in FIG. 11, the variable resistance memory cell device 700 of this example includes a memory cell array 710 including a plurality of memory cells each including variable resistance memory cell element MC. Although not shown, each memory cell may further include a switching element, such as a diode or transistor. The memory cell device 700 further includes a plurality of bit lines BL0~BL3 and word lines WL0~WL3, and the memory cells are connected at intersections thereof.

Reference number 735 of FIG. 11 denotes a column decoder, and reference numeral 720 denotes a row decoder. The column decoder 735 includes a plurality of bit line selection transistors BST0~BST3 connected between a node N2 and the respective bit lines BL0~BL3. The row decoder 720 includes a plurality of word line selection transistors WST0~WST3 connected between a reference voltage (e.g., ground GND) and the respective word lines WL0~WL3. The bit line selection transistors BST0~BST3 are respectively controlled by (gated to) first bit line selection signals BLS0~BLS3, and the word line selection transistors WST0~WST1 are respectively controlled by (gate to) word line selection signals WLS0~WLS3. The first bit line selection signals BLS0~BLS3 may, for example, correspond to column addresses, and the word line selection signals WLS0~WLS3 may, for example, correspond to row addresses.

The variable resistance memory cell device of FIG. 11 further includes a compliance circuit 730, a voltage sensor 740, and a by-pass transistor 745 (BPTR).

The compliance circuit 730 includes a plurality of compliance transistors CLTR0~CLTR3 connected between a node N1 and the respective bit lines BL0~BL3. The compliance circuit 730 functions analogously to the column decoder 735 in that the compliance transistors CLTR0~CLTR3 are controlled by second bit line selection signals BLS0'~BLS3' which correspond to the first bit line selection signals BLS0~BLS3. However, each compliance transistor CLTR0~CLTR3 and/or second bit line selections signal BLS0'~BLS3' is configured to establish a given current limiting resistive element for the variable resistive memory cells connected to each bit line BL0~BL3. The first bit line selection signal BLS0~BLS3 may be the same the second bit line selection signal BLS0'~BLS3', or the first bit line selection signal BLS0~BLS3 may be separately generated from the second bit line selection signal BLS0'~BLS3'.

The voltage sensor 740 and by-pass transistor 745 of FIG. 11 generally correspond to the voltage sensor 530 and by-pass transistor 535 shown in previously described FIG. 9. The voltage sensor 740 may, for example, be configured with the inverter 630 of FIG. 10. However, the internal configuration of the voltage sensor 740 is not limited. The by-pass transistor 745 is controlled by (gate to) an output of the voltage sensor 740, and is connected between the node N2 and a reference potential (e.g., ground GND). The voltage sensor is configured to sense a voltage drop at node N2, and to control the by-pass transistor 745 accordingly.

An operation of the variable resistance memory cell device of FIG. 11 will now be described with respect to SET programming of the memory cell 711 of the memory cell array 710.

Initially, word line WL1 and bit line BL1 are selected by the row decoder 720 and column decoder 735, i.e., by turning ON the selection transistors WST1 and BST1 in response to the word and bit line selection signals WLS1 and BLS1. In addition, the compliance transistor CLTR1 is turned ON within the compliance circuit 730 in response to the second bit line selection signal BLS1'. Then, a SET programming pulse (PGM Pulse) is applied to node N1. As a result, the resistance of the variable resistive element MC11 of the memory cell 711 abruptly decreases as described previously in connection with FIGS. 2B and 6, and the memory cell 711 is transitioned to the SET state. The decreased resistance of the memory cell 711 causes a voltage drop at node N2, which is sense by the voltage sensor 740. The voltage sensor 740 responds to the voltage drop by generating the signal Vpass to turn ON the by-pass transistor 735. As a result, the programming current on the bit line BL1 resulting from the programming pulse (PGM Pulse) is diverted to ground, thus bypassing the memory cell (MC) 711.

Figure 12:
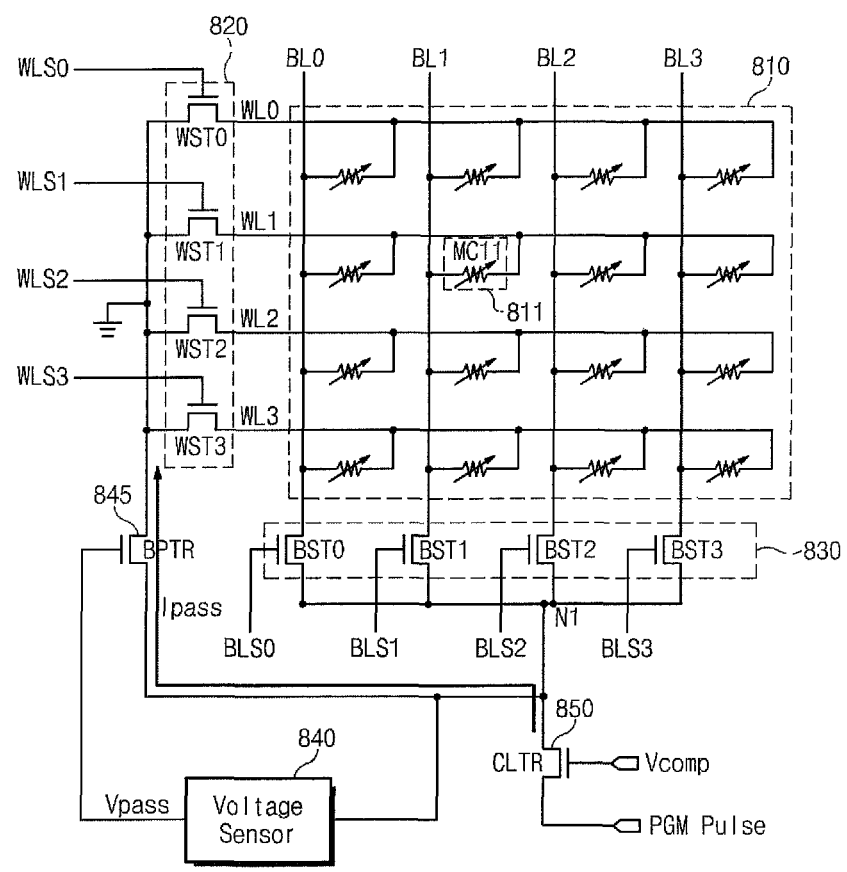
FIG. 12 is a circuit diagram illustrating a variable resistance memory device according to one or more inventive concepts described herein.

FIG. 12 is a circuit diagram illustrating a variable resistance memory cell device according to an embodiment of one or more inventive concepts described herein.

As shown in FIG. 12, the variable resistance memory cell device 800 of this example includes a memory cell array 810 including a plurality of memory cells each including variable resistance memory cell element MC. Although not shown, each memory cell may further include a switching element, such as a diode or transistor. The memory cell device 800 further includes a plurality of bit lines BL0~BL3 and word lines WL0~WL3, and the memory cells are connected at intersections thereof.

Reference number 820 of FIG. 12 denotes a row decoder, and reference numeral 830 denotes a column decoder. The column decoder 830 includes a plurality of bit line selection transistors BST0~BST3 connected between a node N1 and the respective bit lines BL0~BL3. The row decoder 820 includes a plurality of word line selection transistors WST0~WST3 connected between a reference voltage (e.g., ground GND) and the respective word lines WL0~WL3. The bit line selection transistors BST0 ~BST3 are respectively controlled by (gated to) bit line selection signals BLS0~BLS3, and the word line selection transistors WST0~WST1 are respectively controlled by (gate to) word line selection signals WLS0~WLS3. The bit line selection signals BLS0~BLS3 may, for example, correspond to column addresses, and the word line selection signals WLS0~WLS3 may, for example, correspond to row addresses.

The variable resistance memory cell device 800 of FIG. 8 further includes a compliance transistor 850 (CLTR), a voltage sensor 840, and a by-pass transistor 845 (BPTR).

The compliance transistor 850 is connected between node N1 and a terminal receiving a program pulse PGM Pulse. The by-pass transistor 845 is connected between the reference voltage (e.g., ground GND) and node N1, and the voltage sensor 840 has an input connected to node N1, and an output gated to the by-pass transistor 845.

An operation of the variable resistance memory cell device of FIG. 12 will now be described with respect to SET programming of the memory cell 811 of the memory cell array 810.

Initially, word line WL1 and bit line BL1 are selected by the row decoder 820 and column decoder 830, i.e., by turning ON the selection transistors WST1 and BST1 in response to the word and bit line selection signals WLS1 and BLS1. In addition, the compliance transistor 850 is turned ON in response to a compliance signal Vcomp. Then, a SET programming pulse (PGM Pulse) is applied to the compliance transistor 850 and the input of the delay circuit 840. As a result, the resistance of the variable resistive element MC11 of the memory cell 811 abruptly decreases as described previously in connection with FIGS. 2B and 6, and the memory cell 811 is transitioned to the SET state. The decreased resistance of the memory cell 811 causes the voltage a node N1 to drop, and this voltage drop is sense by the voltage sensor 840 which responds by generating the signal Vpass to turn ON the by-pass transistor 845. As a result, the programming current on the bit line BL1 resulting from the programming pulse (PGM Pulse) is diverted to ground, thus electrically bypassing the memory cell (MC) 811.

Figure 13:
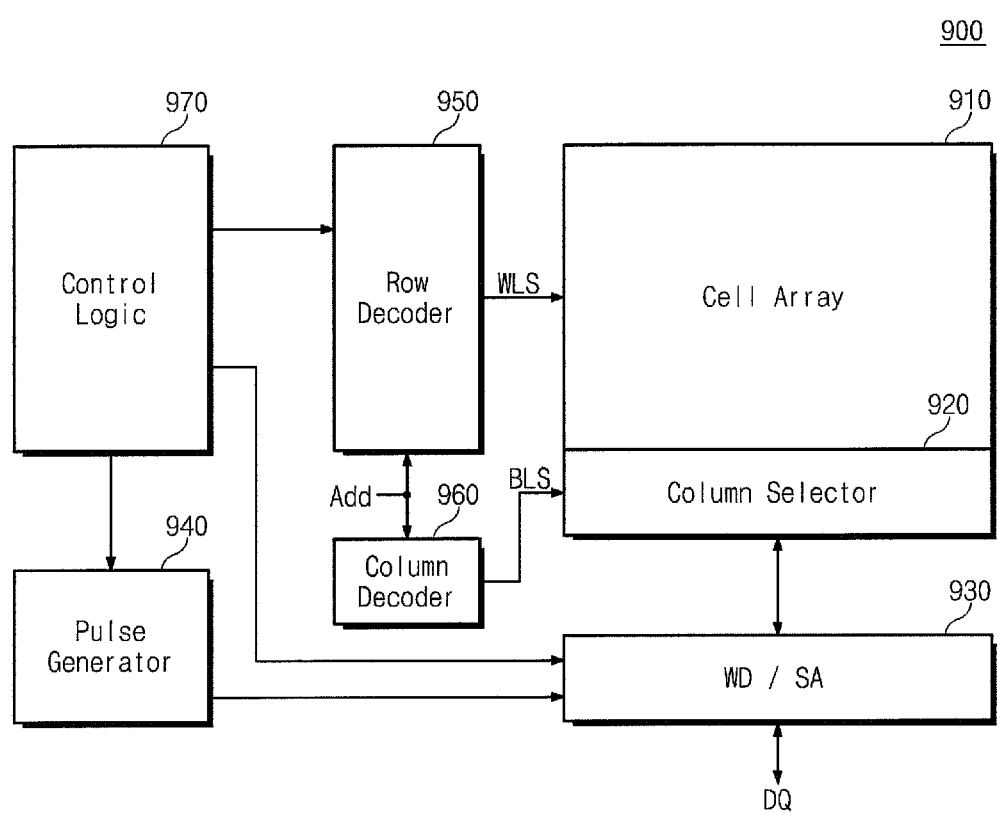
FIG. 13 is a circuit diagram illustrating a variable resistance memory device according to one or more inventive concepts described herein.

FIG. 13 is a block diagram of a variable resistance memory system 900. As shown, the memory system 900 includes a memory cell array composed of variable resistance memory cells connected at intersections of word lines and bit lines, a column selector 920 for selecting bit lines of the memory cell array 910, and a row decoder for decoding an address (Add) to generate word line selections signals (WLS) which select word lines of the memory cell array 910. In addition, the system 900 includes a column decoder which decodes the address (Add) to generate bit line selection signals (BLS) which are utilized to control the column selector 920. The system still further includes control logic 970 which controls an overall operation of the system 900, a pulse generator for generating, for example, SET and REST pulses utilized to program the memory cells of the memory cell array 910, and a write driver/sense amplifier (WD/SA) 930. The WD/SA 930 functions in a write mode to apply programming pulses to the memory cell array 910 according to input data DQ via the column selector 920, and in a read mode to sense stored data (i.e., resistive states) of memory cell array 910 and to generate corresponding output data DQ.

Figure 14:
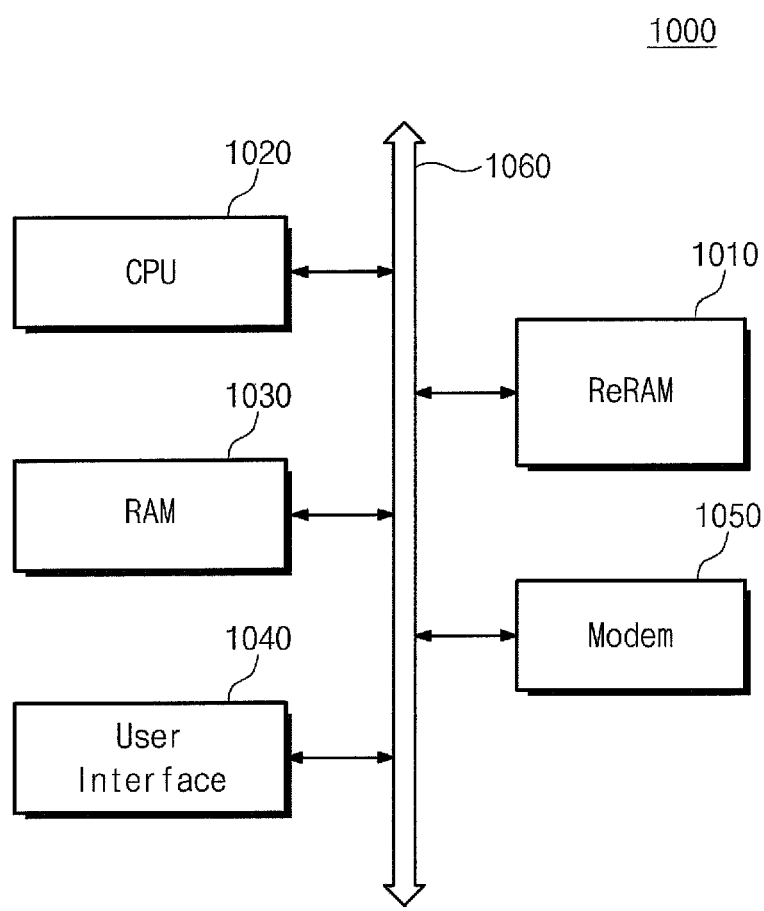
FIG. 14 is a block diagram illustrating a computing system according to one or more inventive concepts described herein.

FIG. 14 is a block diagram of a computational or computing system 1000 incorporating a variable resistance memory device according to one or more of the afore-described inventive concepts. The computational system 1000 generally includes a microprocessor (CPU) 1020, a random access memory (RAM) 1030, a user interface 1040, a modem 1050 such as a baseband chipset, and a variable resistance random access memory ReRAM 1010 electrically connected to a system bus 1060. The ReRAM 1010 is configured according to any one or more of the embodiments described herein. In a case that the system 1000 is a mobile device, a battery (not shown) will additionally be provided to supply an operation voltage of the computing system. Although not illustrated in the drawings, it will be apparent to those skilled in the relevant art that the computing system 1000 may be further provided with an application chipset, a camera image processor (CIS), a mobile DRAM, and so on.

The ReRAM may be configured by an MMC card (Multimedia Card), an SD card (Secure Digital Card), a micro SD card, a memory stick, an ID card, a PCMCIA card, a chip card, a USB card, a smart card, a CF card (Compact Flash Card), and so on.

The nonvolatile ReRAM 1010 can retain its stored data even when its power supply is interrupted. With the increase in use of mobile devices such as cellular phones, PDAs, digital cameras, portable game consoles, and MP3 players, the nonvolatile memory is being widely used as code storage as well as data storage. In addition, the nonvolatile ReRAM may be used in home applications such as HDTV, DVD, router, and GPS.

The ReRAM 1010 may be applied to an embedded system, which is a computing system embedded as a part of other components to perform only a specific computing work imposed on a device including oneself, unlike a typical computer. The embedded system has a central processing unit (CPU) and needs an operating system (OS). The embedded system executes an application under the OS to perform a specific work. Generally, the embedded system is provided to control military devices, industrial devices, communication devices, electric home appliances such as a set-top box, digital television set (DTV), and digital camera, and so on.

The ReRAM memory device of the inventive concepts may be mounted by using various types of packages. For example, the nonvolatile memory device may be mounted by using the packages such as a package on package (PoP), Ball grid arrays (BGAs), Chip Scale Packages (CSPs), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-level Processed Stack Package (WSP).

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A variable resistance memory device comprising:
a variable resistance memory cell;
a by-pass circuit configured to electrically by-pass a programming pulse supplied to the variable resistance memory cell after a resistive state of the variable resistance memory cell has changed in response to the programming pulse, wherein the by-pass circuit comprises a delay circuit and a by-pass switch, and wherein the delay circuit receives the programming pulse and outputs a corresponding delayed signal which controls the by-pass switch to by-pass a current flow into the variable resistance memory cell.

2. The variable resistance memory device of claim 1, wherein the by-pass switch is a transistor electrically connected in parallel with the variable resistance memory cell.

3. The variable resistance memory device of claim 1, further comprising a current limiting element which limits a cell current magnitude of the variable resistance memory cell.

4. The variable resistance memory device of claim 1, wherein the variable resistance memory cell comprises at least one transition metal oxide (TMO).

5. A variable resistance memory device comprising:
a variable resistance memory cell;
a by-pass circuit configured to electrically by-pass a programming pulse supplied to the variable resistance memory cell after a resistive state of the variable resistance memory cell has changed in response to the programming pulse,
wherein the by-pass circuit comprises a voltage sensor and a by-pass switch, and wherein the voltage sensor senses a voltage drop of the variable resistance memory cell, and is responsive to the voltage drop to control the by-pass switch to by-pass a current flow into the variable resistance memory cell.

6. The variable resistance memory device of claim 5, wherein the voltage sensor is an inverter.

7. The variable resistance memory device of claim 5, wherein the by-pass switch is a transistor electrically connected in parallel with the variable resistance memory cell.

8. A variable resistance memory device, comprising:
a variable resistance memory cell array comprising a plurality of variable resistance memory cells electrically connected between a plurality of bit lines and a plurality of words lines;
a current limiting circuit which limits a cell current magnitude of the variable resistance memory cells;
a by-pass circuit configured to electrically by-pass the variable resistance memory cells while a programming pulse is supplied to the variable resistance memory cells after a resistive state of the variable resistance memory cells has changed in response to the programming pulse, wherein a portion of the programming pulse electrically by-passes the variable resistance memory cells through the by-pass circuit,
wherein the current limiting circuit comprises a current limiting transistor connected between a programming pulse terminal and the plurality of bit lines,
wherein the variable resistance memory device further comprises a decoder circuit connected between current limiting transistor and the plurality of bit lines, and
wherein the by-pass circuit comprises a delay circuit and a by-pass switch, and wherein the delay circuit receives the programming pulse and outputs a corresponding delayed signal which controls the by-pass switch to by-pass a current flow into the variable resistance memory cell.

9. The variable resistance memory device of claim 8, wherein the by-pass switch is a transistor connected between a reference voltage and a connection node between the decoder circuit and the current limiting transistor.

10. A variable resistance memory device, comprising:
a variable resistance memory cell array comprising a plurality of variable resistance memory cells electrically connected between a plurality of bit lines and a plurality of words lines;
a current limiting circuit which limits a cell current magnitude of the variable resistance memory cells;
a by-pass circuit configured to electrically by-pass the variable resistance memory cells while a programming pulse is supplied to the variable resistance memory cells after a resistive state of the variable resistance memory cells has changed in response to the programming pulse, wherein a portion of the programming pulse electrically by-passes the variable resistance memory cells through the by-pass circuit,
wherein the current limiting circuit comprises a current limiting transistor connected between a programming pulse terminal and the plurality of bit lines,
wherein the variable resistance memory device further comprises a decoder circuit connected between current limiting transistor and the plurality of bit lines, and
wherein the by-pass circuit comprises a voltage sensor and a by-pass switch, and wherein the voltage sensor senses a voltage drop of the variable resistance memory cells, and is responsive to the voltage drop to control the by-pass switch to by-pass a current flow into the variable resistance memory cells.

11. The variable resistance memory device of claim 10, wherein the by-pass is a transistor connected between a reference voltage and a connection node between the decoder circuit and the current limiting transistor.

12. A variable resistance memory device, comprising:
a variable resistance memory cell array comprising a plurality of variable resistance memory cells electrically connected between a plurality of bit lines and a plurality of words lines;
a current limiting circuit which limits a cell current magnitude of the variable resistance memory cells;
a by-pass circuit configured to electrically by-pass the variable resistance memory cells while a programming pulse is supplied to the variable resistance memory cells after a resistive state of the variable resistance memory cells has changed in response to the programming pulse, wherein a portion of the programming pulse electrically by-passes the variable resistance memory cells through the by-pass circuit,
wherein the current limiting circuit comprises a plurality of current limiting transistors respectively connected between a programming pulse terminal and the respective plurality of bit lines,
wherein the variable resistance memory device further comprises a decoder circuit connected to the plurality of bit lines opposite the plurality of current limiting transistors, and
wherein the by-pass circuit comprises a delay circuit and a by-pass switch, and wherein the delay circuit receives the programming pulse and outputs a corresponding delayed signal which controls the by-pass switch to by-pass a current flow into the variable resistance memory cells.

13. The variable resistance memory device of claim 12, wherein the by-pass switch is a transistor connected between a reference voltage and the decoder circuit.

14. A variable resistance memory device, comprising:
a variable resistance memory cell array comprising a plurality of variable resistance memory cells electrically connected between a plurality of bit lines and a plurality of words lines;
a current limiting circuit which limits a cell current magnitude of the variable resistance memory cells;
a by-pass circuit configured to electrically by-pass the variable resistance memory cells while a programming pulse is supplied to the variable resistance memory cells after a resistive state of the variable resistance memory cells has changed in response to the programming pulse, wherein a portion of the programming pulse electrically by-passes the variable resistance memory cells through the by-pass circuit,
wherein the current limiting circuit comprises a plurality of current limiting transistors respectively connected between a programming pulse terminal and the respective plurality of bit lines,
wherein the variable resistance memory device further comprises a decoder circuit connected to the plurality of bit lines opposite the plurality of current limiting transistors, and
wherein the by-pass circuit comprises a voltage sensor and a by-pass switch, and wherein the voltage sensor senses a voltage drop of the variable resistance memory cells, and is responsive to the voltage drop to control the by-pass switch to by-pass a current flow into the variable resistance memory cells.

15. The variable resistance memory device of claim 14, wherein the by-pass switch is a transistor connected between a reference voltage and the decoder circuit.

* * * * *